United States Patent
McHugh et al.

(10) Patent No.: US 6,735,085 B2
(45) Date of Patent: May 11, 2004

(54) FOLDABLE RETENTION DEVICE FOR LAND GRID ARRAY CONNECTOR ASSEMBLY

(75) Inventors: Robert G. McHugh, Golden, CO (US); Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/222,685

(22) Filed: Aug. 15, 2002

(65) Prior Publication Data

US 2004/0032720 A1 Feb. 19, 2004

(51) Int. Cl.⁷ .................................................. H05K 7/20
(52) U.S. Cl. ......................... 361/719; 24/458; 257/719; 361/695; 439/485
(58) Field of Search ........................... 439/342, 485; 174/16.3; 165/80.3, 185, 121–126; 267/150, 158, 160; 24/453, 457, 458; 257/718, 719, 726, 727; 248/505, 510; 361/694, 695, 697, 703, 704, 717–719

(56) References Cited

U.S. PATENT DOCUMENTS

| | | | | |
|---|---|---|---|---|
| 5,448,449 A | * | 9/1995 | Bright et al. | 361/704 |
| 5,485,351 A | * | 1/1996 | Hopfer et al. | 361/704 |
| 6,414,848 B1 | * | 7/2002 | Chen | 361/704 |
| 6,449,154 B1 | * | 9/2002 | Yoneyama et al. | 361/704 |
| 6,450,248 B1 | * | 9/2002 | Chang | 165/80.3 |
| 6,477,049 B1 | * | 11/2002 | Lin | 361/704 |
| 6,485,320 B1 | * | 11/2002 | Ma | 439/342 |
| 6,570,763 B1 | * | 5/2003 | McHugh et al. | |
| 6,574,109 B1 | * | 6/2003 | McHugh et al. | 361/719 |

\* cited by examiner

Primary Examiner—G. Tolin
(74) Attorney, Agent, or Firm—Wei Te Chung

(57) ABSTRACT

A retention device (6) includes a main frame (60), a front and a rear foldable plates (61, 62) assembled to the main frame, a spring clip (65) and an actuating lever (66). The main frame is arranged for surrounding a package upon a socket (not shown). The spring clip is pivotably assembled to the rear foldable plate. The actuating lever is pivotably assembled to the front foldable plate. The actuating lever is rotated to lock the spring clip thereby the spring clip retaining a heat sink module (5) upon the package and the socket.

15 Claims, 5 Drawing Sheets

FOLDABLE RETENTION DEVICE FOR LAND GRID ARRAY CONNECTOR ASSEMBLY

CROSS-REFERENCE TO RELATED APPLICATIONS

This patent application is a Co-pending Application of Patent Applications with an unknown serial number, entitled "FOLDABLE RETENTION DEVICE FOR LAND GRID ARRAY CONNECTOR ASSEMBLY", filed in an earlier time, invented by the same inventors as this patent application; Ser. No. 10/027,706, entitled "LAND GRID ARRAY CONNECTOR ASSEMBLY", filed on Dec. 19, 2001, invented by Hao-Yun Ma; Ser. No. 09/835,932, entitled "HEAT SINK ASSEMBLY RETAINER DEVICE", filed on Apr. 10, 2001, invented by Atsushi Yoneyama et al.; all assigned to the same assignee as this patent application.

BACKGROUND OF THE INVENTION

1. Field of the Invention

The present invention relates to a retention device, and particularly to a retention device for retaining a heat sink module upon an LGA socket for dissipating heat.

2. Description of Related Art

IC packages having leads arranged in a land grid array (LGA) are well known as LGA packages. Connectors for removably mounting an LGA package on a PCB (Printed Circuit Board) are known as LGA sockets which are introduced, for example, in the internet website address: http://www.kns.com/prodserv/test-division/products/sockets/BGA-LGA.asp. LGA sockets, as described in U.S. Pat. Nos. 5,282,111, 5,485,351 and 5,702,256, each comprise a substantially flat insulative housing defining an array of passageways with electrical contacts received therein corresponding with the array of leads of the LGA package. Each contact has a pair of free ends oppositely projecting beyond external surfaces of the socket housing for respectively engaging with corresponding contact pads on a bottom surface of the LGA package and on a top surface of the PCB. To dissipate the heat generated by an IC chip incorporated in the LGA package, a heat sink device is commonly applied.

Different devices are disclosed by the prior art for clamping the LGA package, the LGA socket and the PCB together, thereby establishing an electrical connection between the contacts of the LGA socket and corresponding contact pads of the LGA package and the PCB. U.S. Pat. No. 4,906,194 discloses an LGA package assembly including an upper support clip, an LGA package, an LGA socket, a PCB, an insulator, and a lower support clip. The components of the LGA package assembly are fastened to each other by a plurality of threaded screw members sequentially extending through bores defined in each component. Such a manner of assembling is laborious and tedious. U.S. Pat. No. 5,847,928 discloses another LGA package assembly including a heat sink, an LGA package, an LGA socket and a PCB. The components are fastened together by a clip disposed on a bottom side of the PCB which has two upward extending arms inserted in aligned apertures of the PCB and the heat sink. One problem with this design is that the clip has the same profile no matter whether the heat sink is mounted upon the LGA package or not; this is disadvantageous in view of the inventory and shipment of the clip.

Hence, an improved retention device for an LGA connector assembly is required to overcome the disadvantages of the conventional retention device.

SUMMARY OF THE INVENTION

The object of the present invention is to provide a foldable retention device for an LGA connector assembly, wherein the retention device is foldable so that its profile can be reduced.

In order to achieve the object set forth, a retention device of the present invention comprises a main frame, a pair of front foldable plates, a pair of rear foldable plates, a spring clip and an actuating lever. The front and rear foldable plates are pivotably assembled to the main frame. The spring clip is pivotably assembled to the rear foldable plates, and comprises a downward extending pressing portion for pressing against the heat sink module and a receiving arm extending forwardly from a front end thereof. The actuating lever is pivotably assembled to the front foldable plates and rotated to lock the receiving arm. Therefore, the spring clip is pressed downwardly whereby the pressing portions press against a heat sink module and retain the heat sink module and an LGA package upon an LGA socket. While the heat sink module and the LGA package are removed from the LGA socket, the actuating lever and the spring clip maybe foldable to reduce occupied space.

Other objects, advantages and novel features of the invention will become more apparent from the following detailed description when taken in conjunction with the accompanying drawings.

DETAILED DESCRIPTION OF THE INVENTION

Figure 1:
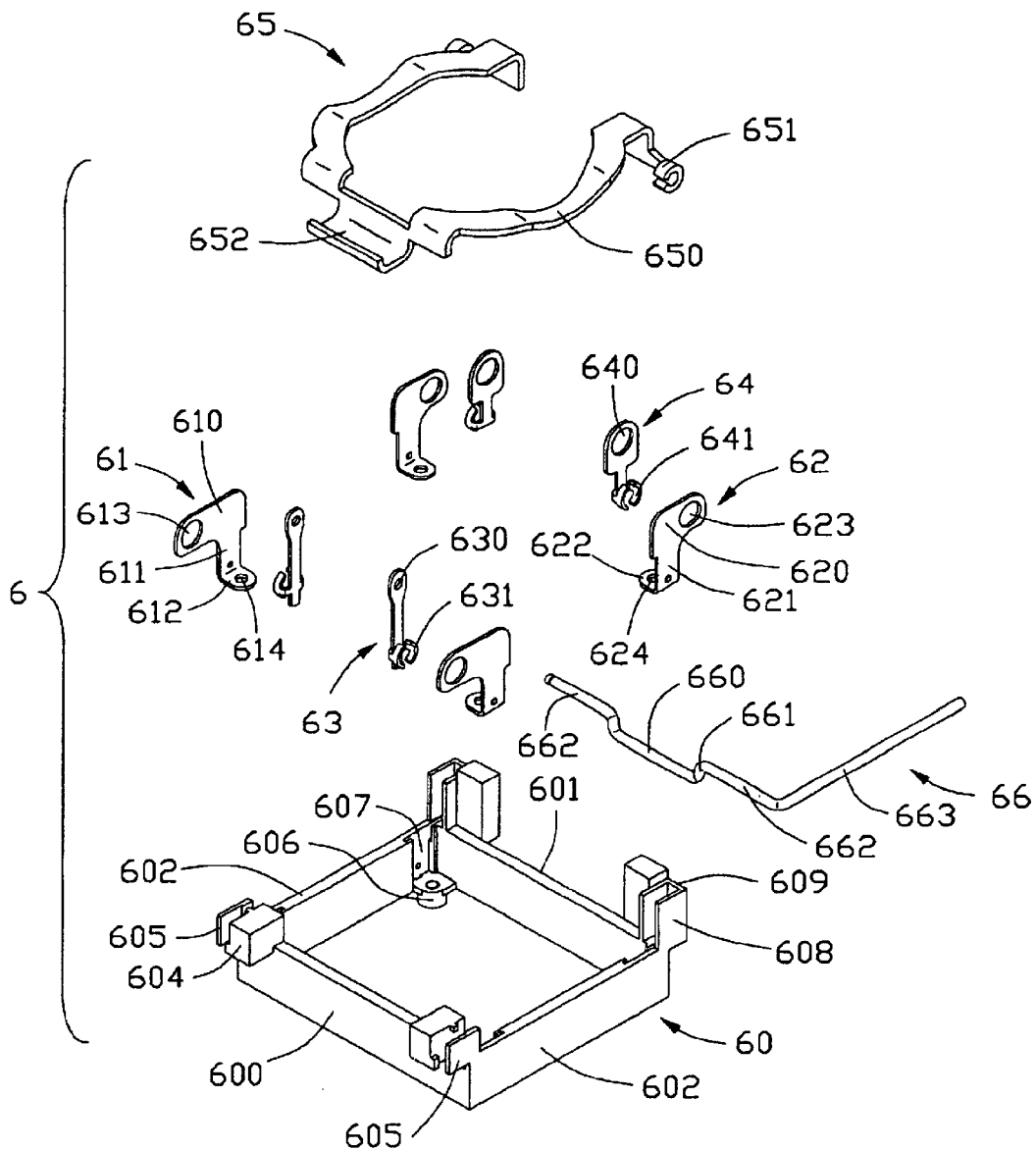
FIG. 1 is an exploded, perspective view of a retention device in accordance with the present invention.

Reference will now be made to the drawing figures to describe the present invention in detail.

Figure 2:
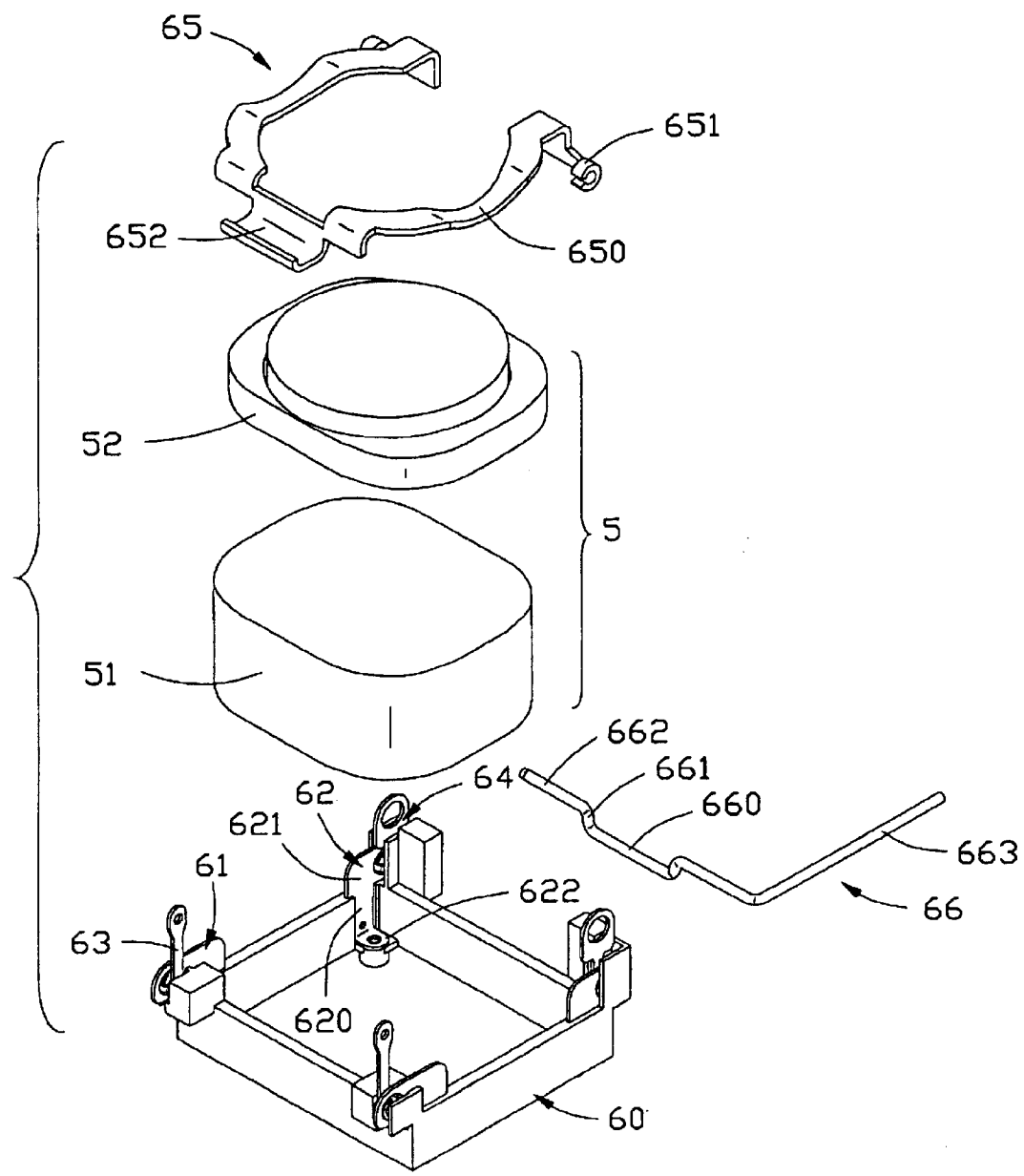
FIG. 2 is an exploded, perspective view of the retention device and a heat sink module.
Figure 3:
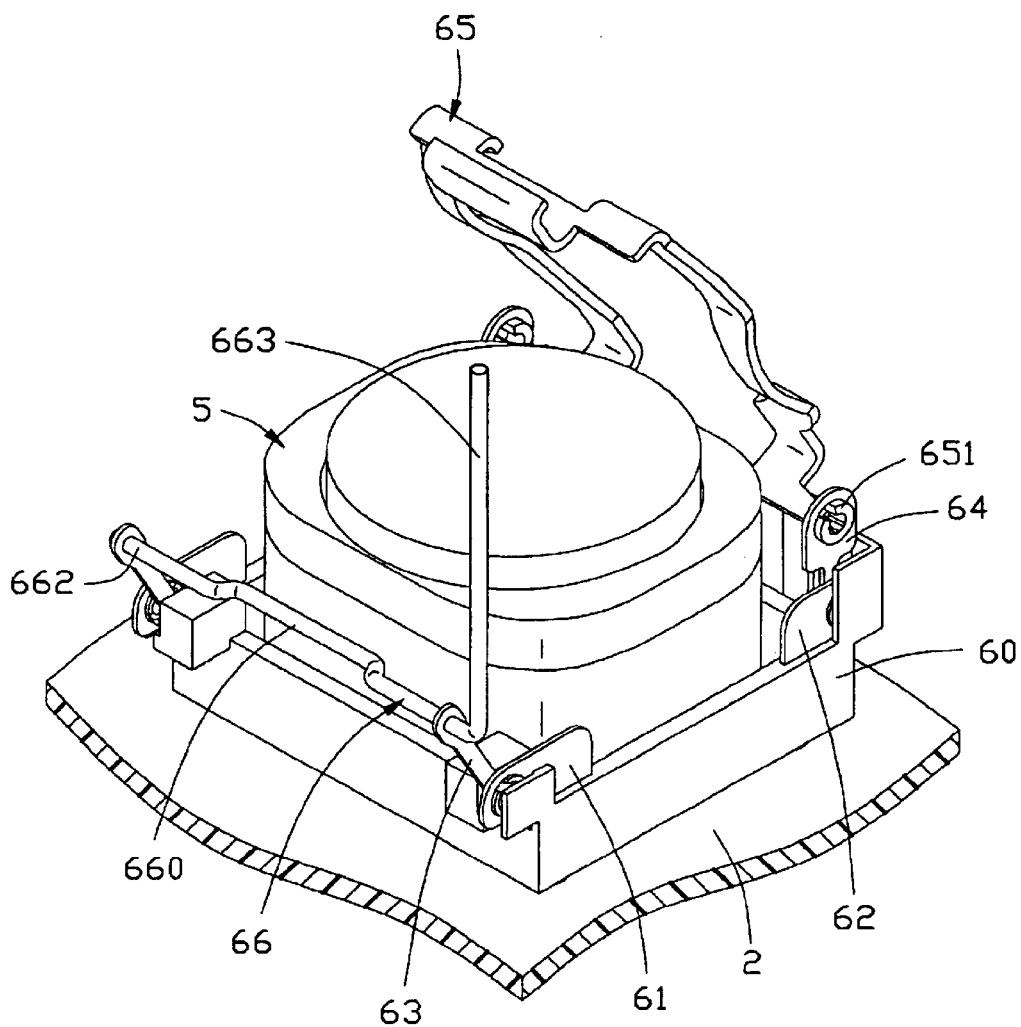
FIG. 3 is a perspective view of the retention device and the heat sink of FIG. 2 assembled upon a PCB.

Referring to FIGS. 1–3, a retention device 6 is frequently used to retain a heat sink module 5 upon an LGA package and a LGA socket (not shown) which are assembled to a PCB 2. The retention device 6 comprises a rectangular main frame 60, a pair of metal front retaining plates 61, a pair of metal rear retaining plates 62, a pair of metal front connecting plates (the lever holder) 63, a pair of metal rear connecting plates (the clip holder) 64, a metal spring clip 65 and an actuating lever 66.

The main frame 60 comprises a front wall 600, a rear wall 601 and a pair of opposite side walls 602 connecting the front wall 600 and rear wall 601. Each of the side walls 602 defines a pair of receiving recesses 607 in opposite ends thereof. A mounting post 606 is integrally formed at a bottom of each corner of the rectangular main frame 60. A pair of opposite front retention blocks 604 is formed on lateral ends of the front wall 600 and a pair of front retaining walls 605 corresponding to the retention blocks 604 is formed on front ends of the side walls 602. Similarly, two pairs of rear retaining walls 608 are formed on rear ends of the side walls 602. In addition, a pair of blocking/stopper walls 609 is provided for connecting corresponding rear retaining walls 608 at rear end thereof.

Each of the front retaining plates 61 comprises a front main plate 610, a front mounting section 611 extending downwardly from a rear end of the front main plate 610 and a horizontal front bottom plate 612 extending inwardly from a bottom end of the front mounting section 611. Similarly, each of the rear retaining plates 62 comprises a rear main plate 620, a rear mounting section 621 extending downwardly from a front end of the rear main plate 620 and a horizontal rear bottom plate 622 extending inwardly from a bottom end of the rear mounting section 621. The front (rear) main plates 61(62) each define a first receiving hole 613 (623) and the front (rear) bottom plates 612 (622) each define a second receiving hole 614(624).

Each of the front (rear) connecting plates 63 (64) comprises a receiving hole 630 (640) in a top end thereof and a connecting pivot 631 (641) at a bottom end thereof.

The spring clip 65 comprises a pair of opposite downward extending pressing portions 650, a pair of opposite receiving pivots 651 extending outwardly from rear ends of corresponding pressing portions 650 and a bowed receiving arm 652 at a front end of the pressing portion 650.

The actuating lever 66 comprises a driving arm 660, a pair of connecting arms 661 bent upwardly from lateral ends of the driving arm 660, a pair of locating arms 662 extending outwardly from top ends of the connecting arms 661 and a handle 663 extending from an end of one locating arm 662.

In assembly of the retention device 6, the front (rear) connecting plates 63 (64) are assembled to corresponding front (rear) retaining plates 61 (62) with the connecting pivots 631 (641) being received in corresponding first receiving holes 613 (623) of the front (rear) retaining plates 61 (62). Successively, the actuating lever 66 is assembled to the front connecting plates 63 with the locating arms 662 being received in corresponding receiving holes 630 of the front connecting plates 63. The spring clip 65 is assembled to the rear connecting plates 64 with the receiving pivots 651 being received in corresponding receiving holes 640 of the rear connecting plates 64. The front (rear) retaining plates 61 (62) are assembled to corresponding side walls 602 with the front (rear) mounting sections 611 (621) being received in corresponding receiving recesses 607 of the side walls 602. The front main plates 610 are between the front retention block 604 and the front retaining wall 605 and the rear main plates 620 are between the rear retaining wall 608. Bolts (not shown) are assembled through corresponding second receiving holes 614 (624) into holes (not labeled) of the mounting posts 606 and the PCB 2 thereby securely retaining the front (rear) retaining plates 61(62) on the main frame 60 and the main frame 60 on the PCB 2. The blocking walls 609 prevent the rear connecting plate 64 from rearward rotating unduly.

Figure 4:
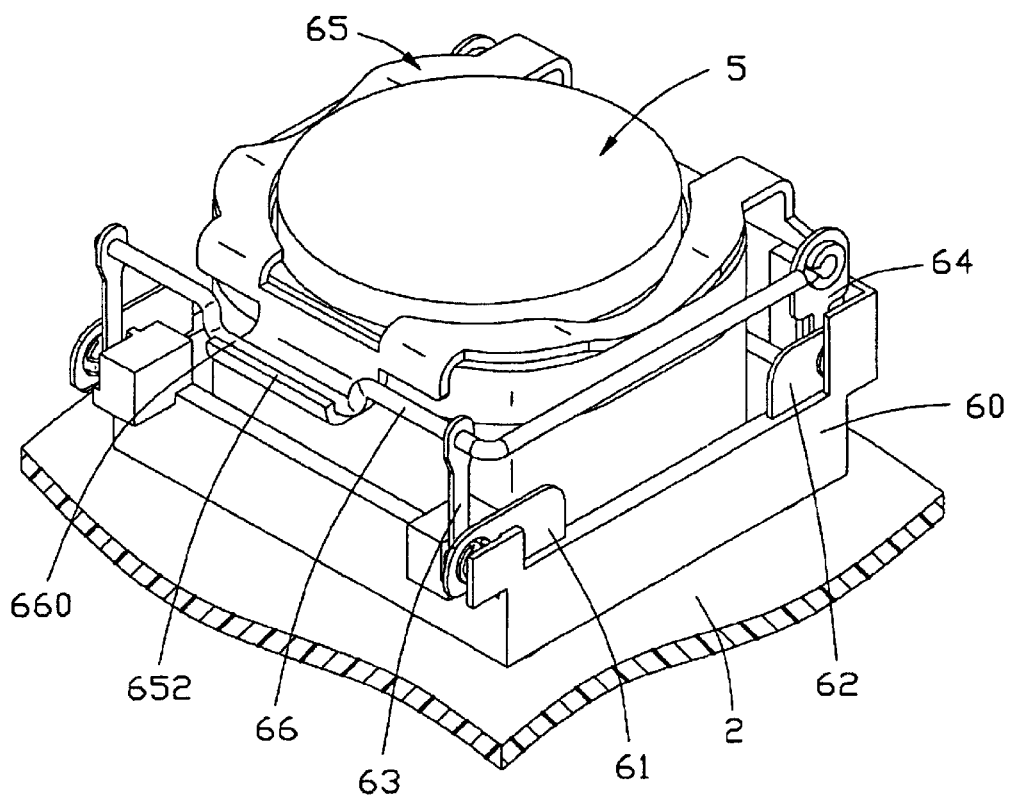
FIG. 4 is an assembled, perspective view of the retention device, the heat sink and the PCB of FIG. 3.

Referring to FIGS. 3–4, the main frame 60 of the retention device 6 is assembled to the PCB 2 around the LGA package and the LGA socket. The heat sink module 5, which includes a heat sink 51 and a fan 52 is mounted in the main frame 60 with the heat sink 51 in thermal contact with the LGA package and the fan 52 on the heat sink 51. In manipulation, the spring clip 65 is pivotably moved to a horizontal position upon the heat sink module 5 with the rear connecting plates 64 pivotably rotated to a vertical position. The front connecting plates 63 are rotated to a vertical position and the actuating lever 66 is rotated with the driving arm 660 moved from an upper position to a lower position. The driving arm 660 locks the receiving arm 652 whereby the pressing portions 650 of the spring clip 65 press against the heat sink module 5. Thus, the heat sink module 5 is securely and firmly engaged with the LGA package to effectively dissipate heat generated therefrom.

Figure 5:
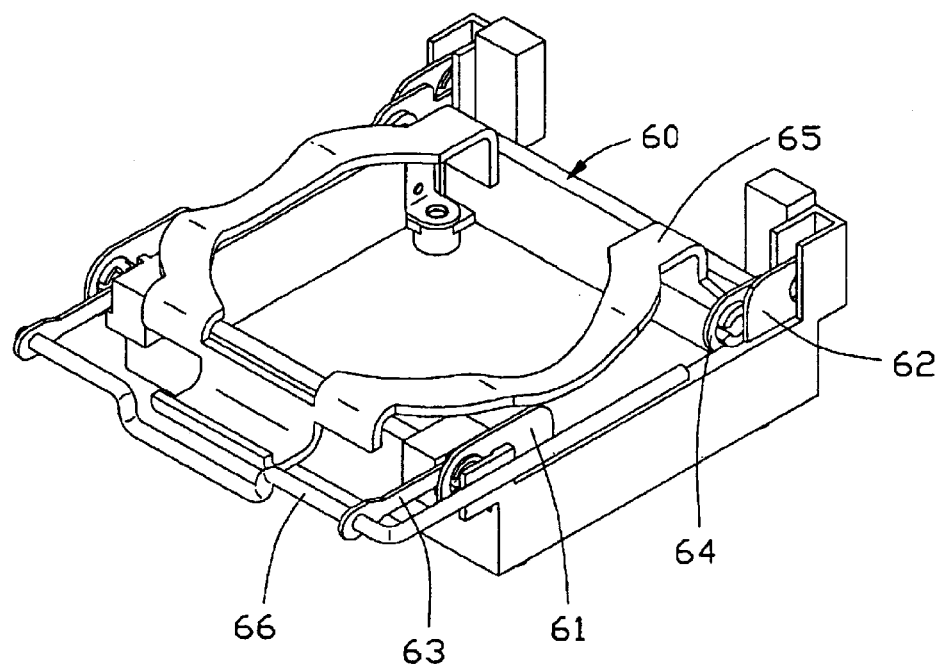
FIG. 5 is a perspective view of the retention device in a folded position.

Referring to FIG. 5, while the LGA package and the heat sink module 5 are removed from the LGA socket, the retention device 6 may be folded to reduce occupied space. The front and rear connecting plates 63, 64 are rotated forwardly to a horizontal position and the handle 663 of the actuating lever 66 is lowered. Therefore, the retention device 6 has a lower profile and occupies a smaller space to facilitate shipment and storage.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retention device for securely retaining a heat sink module and an electronic package upon a socket, comprising:
   a main frame adapted for surrounding the package and the socket;
   a front and a rear foldable plates being attached to the main frame and spaced from each other;
   a spring clip being pivotably assembled to the rear foldable retaining plate; and
   an actuating lever being pivotably assembled to the front foldable plate, and being engageable with the spring clip to retain the heat sink module upon the electronic package; wherein
   the spring clip and the actuating lever are capable to move to a lower position so that the retention device can have a lower profile.

2. The retention device as described in claim 1, wherein the main frame defines receiving rooms for receiving the front and rear foldable retaining plate.

3. The retention device as described in claim 1, wherein the front foldable plate comprises a front retaining plate attached to the main frame and a front connecting plate rotatably assembled to the front retaining plate and pivotably connecting the actuating lever.

4. The retention device as described in claim 3, wherein the front retaining plate defines a hole for receiving a portion of the front connecting plate.

5. The retention device as described in claim 1, wherein the rear foldable plate comprises a rear retaining plate attached to the main frame and a rear connecting plate rotatably assembled to the rear retaining plate and pivotably connecting the spring clip.

6. The retention device as described in claim 5 wherein the rear retaining plate defines a hole for receiving a portion of the rear connecting plate.

7. The retention device as described in claim 1, wherein the actuating lever comprises a driving arm for pressing the spring clip, a connecting arm bent from an end of the driving arm, a locating arm extending outwardly from the connecting arm and a handle extending perpendicularly from the locating arm.

8. The retention device as described in claim 1, wherein the front and rear connecting plates respectively defines a receiving hole for respectively receiving a connecting portion of the actuating lever and the spring clip.

9. A retention device assembly comprising:
a retention device including:
- a main fame mounted on a printed circuit board;
- a clip holder moveably mounted on one end of the main frame;
- a clip pivotally mounted on said clip holder;
- a lever holder moveably mounted on the other end of the main frame opposite to clip holder;
- an actuating lever pivotally mounted on the lever holder and cooperating with the clip to hold a heat sink on the printed circuit board; wherein
  - all the clip, the clip holder, the lever and the lever holder are arranged to extend substantially horizontally to keep the retention device in a low profile.

10. The retention device as described in claim 9, wherein at least one of said clip holder and said lever holder is pivotally mounted on the main frame.

11. The retention device as described in claim 9, wherein both said clip holder and said lever holder are pivotally mounted on the main frame.

12. The retention device as described in claim 11, wherein both said clip holder and said lever holder are directed to a same direction when said clip holder and said lever holder extend horizontally.

13. The retention device as described in claim 12, further including stopper means for assuring both said clip holder and said lever holder being rotated toward a same direction.

14. A retention device assembly comprising:
printed circuit board;
a retention device including:
- a main frame mounted on the printed circuit board;
- a clip holder moveably mounted on one end of the main frame;
- a clip pivotally mounted on the clip holder; and
- a lever located on the other end of the main frame and pivotally relative to the main frame, said lever being engageable with the clip for holding a heat sink on the printed circuit board; wherein
  - the main frame includes a stopper wall around said end of the main frame to prevent said clip holder from moving beyond an outermost contour of the main frame in one direction so that said clip holder is only allowed to move in an opposite direction to deep a low profile of the retention device.

15. The assembly as described in claim 14, wherein said clip holder is pivotal mounted on the main frame.

* * * * *